(12) United States Patent
Chiang et al.

(10) Patent No.: US 6,818,495 B1
(45) Date of Patent: Nov. 16, 2004

(54) METHOD FOR FORMING HIGH PURITY SILICON OXIDE FIELD OXIDE ISOLATION REGION

(76) Inventors: Min-Hsiung Chiang, 121 Park Ave. 3, Science-Based Ind. Park, Hsin-Chu (TW); Jin-Yuan Lee, 121 Park Ave. 3, Science-Based Ind. Park, Hsin-Chu (TW); Jenn Ming Huang, 121 Park Ave. 3, Science-Based Ind. Park, Hsin-Chu (TW)

( * ) Notice: Subject to any disclaimer, the term of this patent is extended or adjusted under 35 U.S.C. 154(b) by 0 days.

(21) Appl. No.: 09/325,951

(22) Filed: Jun. 4, 1999

(51) Int. Cl.$^7$ .................. H01L 21/8238; H01L 21/336; H01L 21/76
(52) U.S. Cl. .................. 438/225; 438/297; 438/452; 438/439
(58) Field of Search .................. 438/225, 297, 438/452, 439

(56) References Cited

U.S. PATENT DOCUMENTS

| | | | |
|---|---|---|---|
| 3,853,496 A | * 12/1974 | Kim | 438/287 |
| 5,151,381 A | 9/1992 | Liu et al. | 437/69 |
| 5,453,397 A | * 9/1995 | Ema et al. | |
| 5,554,560 A | 9/1996 | Hsue et al. | 437/69 |
| 5,637,528 A | * 6/1997 | Higashitani et al. | |
| 5,686,344 A | 11/1997 | Lee | 437/69 |
| 5,712,186 A | * 1/1998 | Thakur et al. | 438/440 |
| 5,739,063 A | * 4/1998 | Liu et al. | |
| 5,789,306 A | * 8/1998 | Roberts et al. | 438/452 |
| 5,985,738 A | * 11/1999 | Jang et al. | |

OTHER PUBLICATIONS

Wolf; Silicon Processing for the VLSI Era vol. 1; 1986; pp. 209–210.*

* cited by examiner

Primary Examiner—John F. Niebling
Assistant Examiner—Ron Pompey

(57) ABSTRACT

A method for forming within a silicon semiconductor substrate employed within a microelectronics fabrication a silicon oxide dielectric layer. There is provided a silicon semiconductor substrate. There is formed upon the silicon semiconductor substrate a blanket silicon oxide pad oxide layer. There is then formed upon the pad oxide layer a patterned silicon nitride masking layer delineating active regions of the silicon semiconductor substrate from isolation regions. There is formed upon the isolation regions by thermal oxidation of the semiconductor silicon substrate in a dry oxidizing environment at an elevated temperature a thick silicon oxide dielectric layer employed as a field oxide (FOX) dielectric isolation layer formed through the silicon nitride patterned masking layer. There is then stripped from the silicon semiconductor substrate the patterned silicon nitride layer, permitting fabrication of microelectronics structures within and upon the semiconductor silicon substrate employing thick silicon oxide field oxide (FOX) dielectric isolation regions without foreign phases or inhomogeneities formed in the "bird's beak" region therein.

18 Claims, 1 Drawing Sheet

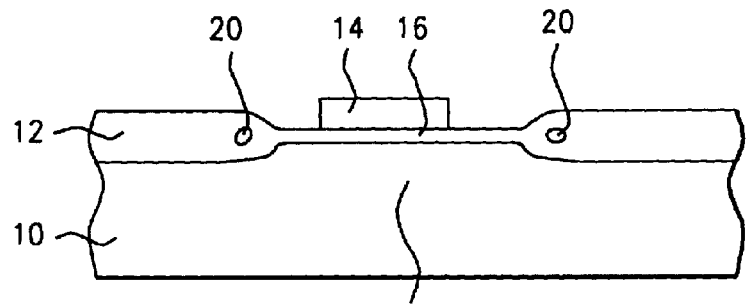
FIG. 1 - Prior Art
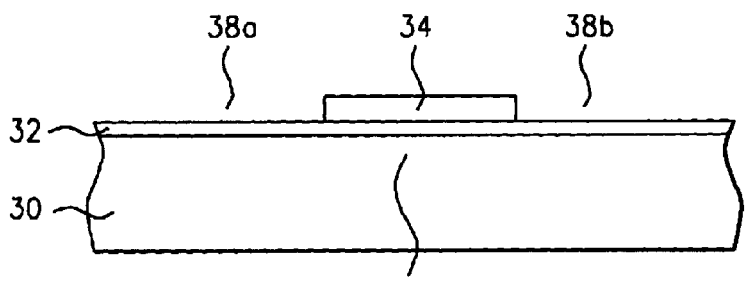
FIG. 2
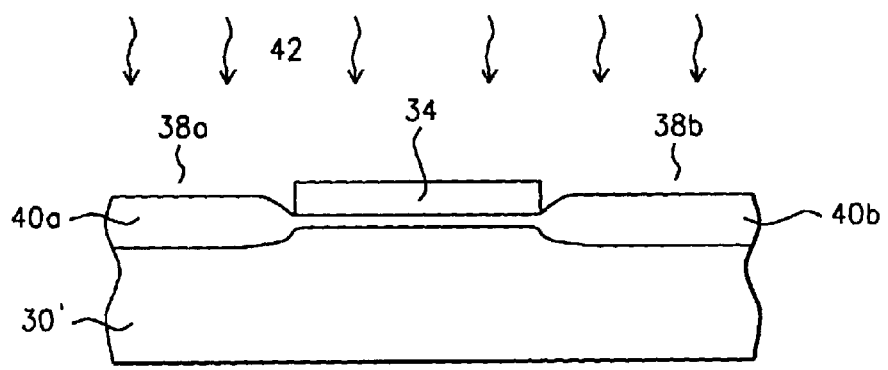
FIG. 3
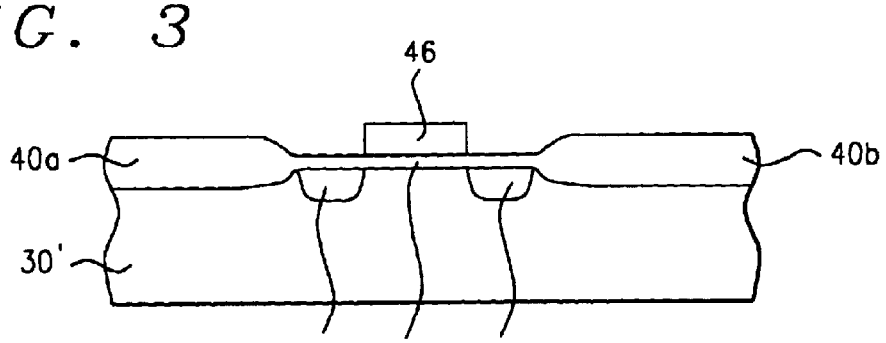
FIG. 4

METHOD FOR FORMING HIGH PURITY SILICON OXIDE FIELD OXIDE ISOLATION REGION

BACKGROUND OF THE INVENTION

1. Field of the Invention

This invention relates to methods for forming silicon oxide dielectric isolation layers in integrated circuit devices by thermal oxidation of silicon. More particularly, the invention relates to methods of dry oxidation of silicon to form high purity silicon oxide dielectric field oxide isolation layers.

2. Description of the Related Art

Microelectronics fabrication of integrated circuits is commonly done employing silicon semiconductor substrates and silicon semiconductor layers formed on those substrates to form the components of the integrated circuit microelectronics fabrication. The dielectric isolation of portions of the silicon substrate area is achieved by a thick silicon oxide dielectric layer called a field oxide (FOX) isolation layer. The formation of the field oxide (FOX) isolation layer is accomplished by the method of local oxidation of silicon (LOCOS), whereby a portion of a silicon device area is protected from oxidation by a layer of silicon nitride impervious to an oxidant species, while forming the silicon oxide dielectric field oxide (FOX) isolation layer in the region adjacent to the protected area. Subsequently, the silicon nitride masking layer is removed and generally replaced by another silicon oxide dielectric layer, usually thinner than the silicon oxide dielectric field oxide (FOX) isolation layer, also formed by thermal oxidation of silicon.

The silicon substrate area wherein there has not been formed a thick silicon oxide field oxide (FOX) isolation layer is the region in which active devices are to be located. A typical active device is the field effect transistor (FET) device, in which a thin silicon oxide dielectric layer serves as the gate oxide insulation layer upon the silicon substrate in the active device area between the silicon substrate channel region and the polysilicon gate electrode layer. The region where the relatively thick field oxide (FOX) isolation layer adjoins the much thinner silicon oxide gate oxide insulation layer underneath the gate electrode exhibits a characteristic appearance known as a "bird's beak" and is a region of considerable interaction of physical stresses and chemical interactions due to the different material phases intimately involved.

The formation of silicon oxide dielectric field oxide (FOX) isolation layers and silicon oxide dielectric gate oxide insulation layers by thermal oxidation of silicon employing silicon nitride layers for selective masking, although satisfactory in general is not without problems in the art of integrated circuit microelectronics fabrication. In particular, the formation of silicon oxide layers of optimal purity so that foreign phases and contaminant ionic species are minimized is difficult because of the very long oxidation times typically required to form the thick silicon oxide layers required. The formation of heterogeneous foreign phases in the "bird's beak" region in the silicon oxide dielectric field oxide (FOX) isolation layer adjacent to the original silicon nitride masking layer and now adjacent to the gate oxide layer may concentrate stresses in the otherwise homogeneous silicon oxide dielectric material. This may lead to excessive local etching when attempting to remove the residual phases, resulting in yield losses due to over-etching and in a microporous structure within the silicon oxide dielectric field oxide (FOX) isolation layer. Such a Inicroporous structure may retain deleterious process residues and foreign material, from the gate oxide and electrode formation material and process or the active region masking material and process.

Desirable in the art of integrated circuit microelectronics fabrication are methods for selective oxidation of silicon to form thick silicon oxide field oxide (FOX) isolation layers of silicon oxide dielectric material without inhomogeneities of composition or structure, particularly at interfaces and adjacencies with other portions of the device structure.

Various methods have been disclosed for forming silicon oxide layers for isolating regions of semiconductor substrates within microelectronics fabrications.

For example, Liu et al., in U.S. Pat. No. 5,151,381, disclose a method for forming field isolation silicon oxide layers which reduces or eliminates localized defects known as ribbons. The method employs dry thermal oxidation of silicon at a first temperature less than 1050 degrees centigrade, followed by an oxidation step at a second temperature greater than 1050 degrees centigrade, whereby flow of the field silicon oxide material ensues, thereby reducing stresses compared to conventional oxidation temperatures below 1000 degrees centigrade.

Further, Hsue et al., in U.S. Pat. No. 5,554,560, disclose a method for forming planar silicon oxide field oxide (FOX) isolation layers with improved resistance to formation of localized stringer defects. The method employs local oxidation of silicon with silicon nitride selective masking, and employs a sacrificial layer of spin-on-glass (SOG) dielectric material or anti-reflective coating (ARC) dielectric material to enable the resulting surface of the isolation layer to be more planar by etching back.

Still further, Lee, in U.S. Pat. No. 5,686,344, discloses a method for forming silicon oxide dielectric isolation regions within a silicon substrate in both the device isolation and well regions separating different polarities of silicon. The method employs thermal oxidation of silicon in an environment of O2/H2 at temperatures between 900 and 1000 degrees centigrade to form thick silicon oxide field oxide isolation layers between device wells and silicon oxide dielectric isolation layer within the device well.

Desirable within the art of integrated circuit microelectronics fabrication are additional methods and materials which may be employed for forming field isolation dielectric layers employing thermal oxidation of silicon within which impurity phases, inhomogeneities and defects causing stresses within the integrated circuit microelectronics fabrication are reduced.

It is towards the foregoing goal that the present invention is both generally and more specifically directed.

SUMMARY OF THE INVENTION

A first object of the present invention is to provide a method for forming within a silicon semiconductor substrate employed within an integrated circuit microelectronics fabrication a silicon oxide dielectric layer with minimal foreign inhomogeneities.

A second object of the present invention is to provide a method in accord with the first object of the present invention where there is formed a silicon oxide dielectric field oxide (FOX) isolation layer with minimal foreign inhomogeneities or foreign material employing local dry thermal oxidation of a silicon semiconductor substrate employed within an integrated circuit microelectronics fabrication.

A third object of the present invention is to provide a method in accord with the first object of the present invention or the second object of the present invention, where the method is readily commercially implemented.

In accord with the objects of the present invention, there is provided a method for forming within a semiconductor substrate employed within an integrated circuit microelectronics fabrication a silicon oxide dielectric layer with minimal inclusion of inhomogeneities of phase or composition or other defects which give rise to stresses within the fabrication. To practice the method of the present invention, there is provided a silicon semiconductor substrate employed within a microelectronics fabrication. There is formed upon the substrate a patterned layer of silicon nitride to define regions where there is to be local oxidation to form silicon oxide dielectric layers. Such silicon oxide dielectric layers may be employed to provide field oxide (FOX) dielectric layers for isolation of active device areas. There is then formed in those regions silicon oxide dielectric layers employed as field oxide (FOX) isolation layers by dry thermal oxidation of silicon first at an elevated temperature of at least about 1100 degrees centigrade, followed by optional further oxidation at a lower temperature, to provide a silicon oxide dielectric material essentially free of inhomogeneities of phase or composition which lead to stress within the fabrication upon subsequent fabrication processing.

The present invention provides a method for forming within a silicon semiconductor substrate employed within a microelectronics fabrication employing local dry thermal oxidation a silicon oxide dielectric layer with reduced inhomogeneities of phase or composition and defects which may lead to stresses within the fabrication. The objects are achieved by oxidation first at a temperature of at least about 1100 degrees centigrade or higher.

The present invention may be employed where the substrate is employed within a microelectronics fabrication where the microelectronics fabrication is selected from the group comprising integrated circuit microelectronics fabrications, charge coupled device microelectronics fabrications, solar sell microelectronics fabrications, ceramic substrate microelectronics fabrications and flat panel display microelectronics fabrications.

The method of the present invention employs materials and methods as are known in the art of integrated circuit microelectronics fabrication, but in ranges and sequences which are novel and not anticipated. Thus the method of the present invention is readily commercially implemented.

BRIEF DESCRIPTION OF THE DRAWINGS

The objects, features and advantages of the present invention are understood within the context of the Description of the Preferred Embodiment as set forth below. The Description of the Preferred Embodiment is understood within the context of the accompanying drawings, which form a material part of this disclosure, wherein:

FIG. 1 is a schematic cross-sectional diagram of an integrated circuit microelectronics fabrication which is representative of the prior art.

FIG. 2, FIG. 3 and FIG. 4 are directed towards a general embodiment of the present invention which is a preferred embodiment of the present invention. Shown in FIG. 2 to FIG. 4 is a series of schematic crosssectional diagrams illustrating the results of forming within a silicon semiconductor substrate employed within a microelectronics fabrication a silicon oxide dielectric layer employed as a field oxide (FOX) isolation layer by local dry thermal oxidation with reduced inhomogeneities of phase and composition and defects.

DESCRIPTION OF THE PREFERRED EMBODIMENT

The present invention provides a method for forming within a silicon semiconductor substrate employed within a microelectronics fabrication a silicon oxide dielectric layer employed as a field oxide (FOX) isolation layer by local dry thermal oxidation of the silicon substrate. FIG. 1 is a schematic cross-section of an integrated circuit microelectronics fabrication which is representative of the prior art.

Shown in FIG. 1 is a substrate 10 where there is formed a thick silicon oxide dielectric field oxide (FOX) isolation layer 12 within the substrate 10 and adjacent to a polysilicon gate layer 14 formed over a silicon oxide gate oxide insulation layer 16 over the active device area 18. In the region where the field oxide layer 12 adjoins the gate oxide insulation layer 14, which is referred to as the "bird's beak", there is shown an inclusion of a foreign inhomogeneity 20 which has been determined incident to the present invention to comprise a silicon oxynitride (SiON) material as determined by transmission electron microscopy (TEM) and energy dispersive x-ray analysis (EDA).

Referring now to FIG. 2 to FIG. 4, there is shown a series of schematic cross-sectional diagrams illustrating the fabrication of a microelectronics fabrication in accord with the method of the present invention. FIG. 2 is a schematic cross-sectional diagram of a microelectronics fabrication at an early stage in its fabrication according to the preferred embodiment of the present invention.

Shown in FIG. 2 is a silicon semiconductor substrate 30 upon which has been formed a silicon oxide pad oxide layer 32. Formed upon the silicon oxide pad oxide layer 32 is a patterned silicon nitride layer 34 wherein the pattern delineates the region 36, where there is to be formed active devices within the substrate, from the regions 38a and 38b where there is to be formed field oxide (FOX) isolation regions.

With respect to the substrate 30, the substrate 30 is a silicon semiconductor substrate. The substrate 30 may be the substrate itself employed within the microelectronics fabrication. The silicon semiconductor substrate may be selected from the group comprising single crystalline silicon, polycrystalline silicon and amorphous silicon. Preferably, the silicon semiconductor substrate is a single crystalline silicon wafer of (100) crystal orientation of either N-type or P-type doping.

With respect to the silicon oxide pad oxide layer 32, the silicon oxide pad oxide layer 32 is formed employing thermal oxidation of the silicon semiconductor substrate 30 in the active region 36, the field isolation regions 38a and 38b and elsewhere on the substrate 30. Preferably the silicon oxide pad oxide layer 32 is formed to a thickness of from about 70 to about 150 angstroms.

With respect to the silicon nitride patterned layer 34, the silicon nitride patterned layer 34 is formed employing methods as are known in the art of integrated circuit microelectronics fabrication including but not limited to chemical vapor deposition (CVD) methods, physical vapor deposition (PVD) sputtering methods and reactive sputtering methods and patterned employing photolithographic methods and materials as are known in the art of microelectronics fabrication. Preferably the silicon nitride layer 34 is formed employing chemical vapor deposition (CVD) to a thickness of from about 900 to about 2000 angstroms.

Referring now to FIG. 3, there is shown a schematic cross-sectional diagram illustrating the results of further processing of the microelectronics fabrication whose schematic cross-sectional diagram is shown in FIG. 2 in accord with the present invention. Shown in FIG. 3 is an integrated circuit microelectronics fabrication otherwise equivalent to the microelectronics fabrication shown in FIG. 2, but wherein there has been formed in the field oxide (FOX) isolation regions 38a and 38b silicon oxide dielectric field oxide (FOX) isolation layers 40a and 40b by local thermal oxidation in a dry oxidizing environment 42.

With respect to the field oxide (FOX) isolation layers 40a and 40b, the silicon oxide dielectric field oxide (FOX) isolation layers 40a and 40b are formed by local oxidation to yield a partially consumed silicon substrate 30' in the regions 38a and 38b through openings in the patterned silicon nitride mask layer 34 employing a dry oxidizing environment 42. The silicon oxide dielectric field oxide (FOX) isolation layers 40a and 40b are formed at a first oxidizing temperature of at least above 1100 degrees centigrade. Preferably, the first thermal oxidation temperature employed is from greater than 1100 to about 1300 degrees centigrade for a time of from about 10 to about 50 minutes. An optional additional oxidizing step may be performed at a temperature not greater than 1100 degrees centigrade. Preferably, the dry oxidizing environment is oxygen gas in a nitrogen carrier gas at a total flow rate of from about 10,000 to about 20,000 standard cubic centimeters per minute (sccm). Preferably, the silicon oxide dielectric field oxide (FOX) isolation layers 40a and 40b are formed to a total thickness of from about 2200 to about 3000 angstroms.

With respect to optional additional thermal oxidation steps, any additional optional thermal oxidation steps employed are performed at lower temperatures than the first thermal oxidation temperature. The formation of the silicon oxide dielectric field oxide (FOX) isolation layers 40a and 40b by local dry thermal oxidation by optional additional second or further oxidation steps at a lower temperature may be employed to form additional thickness of the silicon oxide dielectric field oxide (FOX) isolation layer as desired. Preferably, the optional additional oxidation step employs a temperature not greater than 1100 degrees centigrade, preferably from about 950 to about 1000 degrees centigrade.

The first high temperature oxidation step above 1100 degrees centigrade is employed to form the initial silicon oxide layer at the site of the field oxide (FOX) regions, which serves to prevent the out-diffusion of nitrogen species from the patterned silicon nitride layer 34. Thereafter the continued thermal oxidation to form the FOX layer must take place at a lower temperature to assure no further likelihood of silicon nitride inclusion formation.

With respect to the dry oxidizing environment 42 employed to form the silicon oxide (FOX) dielectric field oxide isolation layers 40a and 40b, the dry oxidizing environment 42 is not required to be maintained at a relative humidity below that of average room temperature relative humidity of about 50 per cent, since this factor is not of significance. The thermal oxidation is carried out at a first temperature at least above 1100 degrees centigrade. Preferably, the first oxidation temperature is from about 1100 to about 1200 degrees centigrade.

Referring now to FIG. 4, there is shown a schematic cross-sectional diagram illustrating the final results of further processing of the integrated circuit microelectronics fabrication whose schematic crosssectional diagram is shown in FIG. 3. Shown in FIG. 4 is an integrated circuit microelectronics fabrication otherwise equivalent to the integrated circuit microelectronics fabrication shown in FIG. 3, but where there has been stripped the silicon nitride masking layer 34 and silicon oxide pad oxide layer 32 and formed in their place a silicon oxide gate oxide insulation layer 44 and a polysilicon gate electrode layer 46. Deposited over the substrate after fabrication of microelectronics structures is complete is a passivation layer 48.

With respect to the removal of the silicon oxide pad oxide layer 32 and silicon nitride masking layer 34, the silicon oxide pad oxide layer 32 and silicon nitride masking layer 34 have been stripped by methods known in the art of microelectronics fabrication. The silicon oxide dielectric gate oxide insulation layer 44 formed in their place is formed by patterned thermal oxidation of the partially consumed silicon semiconductor substrate 30', employing methods as are conventional in the art of field effect transistor (FET) integrated circuit microelectronics fabrication. Preferably the silicon oxide gate insulation layer 44 is formed employing thermal oxidation of the silicon semiconductor substrate 30 in dry oxygen at a temperature of from about 800 to about 950 degrees centigrade for a time of from about 0.5 to about 1.5 hours. Preferably the silicon oxide gate insulation is formed to a thickness of from about 50 to about 90 angstroms.

With respect to the polysilicon gate electrode layer 46 and the passivation layer 48, the polysilicon gate electrode layer 46 and the passivation layer 48 are formed employing materials and methods which are known in the art of integrated circuit microelectronics fabrication. Preferably the gate electrode 46 is formed employing polysilicon deposited by chemical vapor deposition (CVD) to a thickness of from about 800 to about 2000 angstroms. Preferably the passivation layer 48 is formed of silicon oxide dielectric material deposited by chemical vapor deposition (CVD) to a thickness of from about 8000 to about 12,000 angstroms.

The exercise of the method of the present invention provides a silicon oxide dielectric layer employed as a field oxide (FOX) isolation layer formed within a silicon semiconductor substrate employed within an integrated circuit microelectronics fabrication with reduced formation of foreign phases within the silicon oxide dielectric field oxide (FOX) isolation layer, particularly at the juncture of the field oxide layer and the gate oxide layer. This reduction in the presence of foreign material phases within the silicon oxide e layers reduces stress and inhomogeneities of chemical behavior in the "bird's beak" region where the field oxide (FOX) isolation layer adjoins the device gate oxide insulation layers The foreign phase or inhomogeneities observed in the prior art and in following examples are thought to be forms of silicon oxynitride (SiON) as determined by analytical methods including transmission electron microscopy (TEM) and energy dispersive x-ray analysis (EDA).

EXAMPLES

The advantages and benefits of the present invention are more clearly illustrated by the following experimental results. Each silicon semiconductor substrate wafer within a series of three silicon semiconductor wafers was oxidized in various fashions and compared with a silicon semiconductor wafer oxidized in accord with the preferred method of the present invention. All four silicon wafers were single crystalline silicon wafers of (100) crystal orientation with p-type doping to a resistivity of from about 8 to about 12 ohm-centimeter. The first silicon wafer (No. 1) was oxidized in a dry oxidizing environment at 920 degrees centigrade for a time sufficient to form a silicon oxide layer 250 angstroms in thickness, followed by dry oxidation at 100 degrees centigrade for a time sufficient to form additional silicon oxide for a total silicon oxide layer thickness of 2850 angstroms. The second silicon wafer (No. 2) was oxidized in a dry oxidizing environment at 100 degrees centigrade for a time sufficient to form a silicon oxide layer 2850 angstroms in thickness with no additional oxidation. The third silicon wafer (No. 3) was oxidized in a dry oxidizing environment at 1100 degrees centigrade for a time sufficient to form silicon oxide 350 angstroms in thickness, and then oxidized for a second time in a dry oxidizing environment at 1100 degrees centigrade to form additional silicon oxide for a total silicon oxide layer thickness of 2850 angstroms. The fourth silicon wafer (No. 4) was oxidized in a dry oxidizing environment at 1150 degrees centigrade for a time sufficient to form silicon oxide 350 angstroms in thickness, followed by dry oxidation at 1100 degrees for a time to form additional silicon oxide for a total silicon oxide layer thickness of 2850 angstroms. The fourth silicon wafer is representative of the method of the present invention and represents the control sample for the experiment.

All four silicon wafers were sectioned and photomicrographs taken employing analytical methods and materials as are known in the art of microelectronics fabrication to identify any foreign phase or inhomogeneous inclusions, including micro-sectioning followed by transmission electron microscopy (TEM) and energy dispersive x-ray analysis (EDA). The results are given in Table I:

TABLE I

Formation of Foreign Phases in Silicon Oxide (FOX) Layers by Various Oxidation Methods

| Silicon Wafer Number | Oxidation temperature degrees centigrade | Foreign phases or residues in "bird's beak" |
|---|---|---|
| 1 | 920–1100 | yes |
| 2 | 1100 | yes |
| 3 | 1100—1100 | yes |
| 4 | 1150–1100 | no |

It can be seen from the results summarized in Table 1 that the performance of dry oxidation of silicon first at temperatures of about 1150 degrees centigrade and secondly at lower temperatures produces no residues, whereas oxidation at one or more lower temperatures at or below 1100 degrees centigrade for one or several time periods results in formation of residual foreign phases in the silicon oxide layer in the vicinity of the "bird's beak" region. This foreign phase or residue has been identified as silicon oxynitride by the aforementioned analytical methods of TEM and EDA.

The present invention provides a method for format ion of silicon oxide dielectric layers upon a silicon substrate by dry thermal oxidation wherein there is a minimal formation of inhomogeneities and foreign materials within the silicon oxide dielectric layer originating from adjacent regions of the silicon substrate. Although particularly applicable to situations where there is to be formed field oxide (FOX) dielectric isolation layers, the method is suitable for formation of silicon oxide dielectric layers by dry thermal oxidation for general employment in microelectronics fabrication.

While not wishing to be bound by any particular theory, it is speculated that the formation of foreign residual phases in silicon oxide dielectric layers at oxidation temperatures at or below 1100 degrees centigrade is due to the formation of silicon oxtride (SiON). The absence of foreign phases which are speculated to be SiON when silicon oxide is formed at thermal oxidation temperatures initially higher than 1100 degrees centigrade is thought to be at least in part due to the more rapid formation of silicon oxide layer at the higher temperature, which decreases the possibility of nitrogen or nitride species migrating into the silicon oxide dielectric field oxide (FOX) isolation layer s being formed.

The relatively greater thermodynamic stability of silicon oxide with respect to silicon nitride is also thought to be a factor in the reduction of the amount of silicon oxynitride (SiON) residues formed at oxidation temperatures above 1100 degrees centigrade, particularly in the absence of high levels of humidity.

As is understood by a person skilled in the art, the preferred embodiment of the present invention is illustrative of the present invention rather than limiting of the present invention. Revisions and modifications may be made to materials, structures and dimensions through which is provided the preferred embodiment of the present invention while still providing embodiments which are within the spirit, scope and intent of the present invention, as defined by the appended claims.

What is claimed is:

1. A method for forming within a silicon semiconductor substrate employed within an integrated circuit microelectronics fabrication a silicon oxide dielectric field oxide (FOX) isolation layer comprising:

providing a silicon semiconductor substrate;

forming upon the silicon semiconductor substrate a silicon oxide pad oxide layer;

forming upon the silicon oxide pad oxide layer a patterned silicon nitride mask layer;

oxidizing the silicon semiconductor substrate locally at a first temperature of at least above 1100 degrees centigrade, through the patterned silicon nitride mask layer to form silicon oxide dielectric field oxide (FOX) isolation layers which prevent out-difussion of nitrogen species from the silicon nitride mask layer; and then oxidizing the silicon semiconductor substrate further at a second temperature no greater than 1100 degrees centigrade as desired to form greater thickness of silicon oxide layers; wherein the method does not include performing an oxygen implant into the substrate.

2. The method of claim 1 wherein the silicon oxide pad oxide layer is formed employing thermal oxidation of the silicon semiconductor substrate in an oxidizing environment.

3. The method of claim 1 wherein the semiconductor silicon substrate is a single crystalline silicon wafer of (100) crystal orientation.

4. The method of claim 1 wherein the oxidizing environment is a dry oxidizing environment comprising:

oxygen gas;

nitrogen gas; and average room temperature humidity.

5. A method for forming a silicon oxide dielectric field oxide (FOX) isolation layer comprising:

providing a silicon structure;

forming upon the silicon structure a pad oxide layer;

forming upon the pad oxide layer a patterned silicon nitride mask layer;

oxidizing the silicon structure locally at a first temperature of at least above about 1100° C., through the patterned silicon nitride mask layer to form silicon oxide dielectric field oxide (FOX) isolation layers which prevent out-diffusion of nitrogen species from the silicon nitride mask layer; and then oxidizing the silicon structure further at a second temperature no greater than about 1100° C. to form greater thickness of silicon oxide layers; wherein the method does not include performing an oxygen implant into the substrate.

6. The method of claim 5, wherein the pad oxide layer is formed employing thermal oxidation of the silicon structure in an oxidizing environment.

7. The method of claim 5, wherein the silicon structure is a single crystalline silicon wafer of (100) crystal orientation.

8. The method of claim 5, wherein the oxidizing environment is a dry oxidizing environment comprising:

oxygen gas;

nitrogen gas; and average room temperature humidity.

9. The method of claim 1 wherein the first temperature is from at least above 1100 degrees centigrade to about 1300 degrees centigrade and the second temperature is from about 950 degrees centigrade to about 1000 degrees centigrade.

10. The method of claim 5, wherein the first temperature is from at least above 1100 degrees centigrade to about 1300 degrees centigrade and the second temperature is from about 950 degrees centigrade to about 1000 degrees centigrade.

11. A method for forming within a silicon semiconductor substrate employed within an integrated circuit microelectronics fabrication a silicon oxide dielectric field oxide (FOX) isolation layer comprising:

providing a silicon semiconductor substrate;

forming upon the silicon semiconductor substrate a silicon oxide pad oxide layer;

forming upon the silicon oxide pad oxide layer a patterned silicon nitride mask layer;

oxidizing the silicon semiconductor substrate locally in a dry environment at a first temperature of from about 1200 to 1300 degrees centigrade, through the patterned silicon nitride mask layer to form silicon oxide dielectric field oxide (FOX) isolation layers which prevent out-diffusion of nitrogen species from the silicon nitride mask layer; and then oxidizing the silicon semiconductor substrate in a dry environment further at a second temperature from about 950 to 1000 degrees centigrade as desired to form greater thickness of silicon oxide layers.

12. The method of claim 11, wherein the silicon oxide pad oxide layer is formed employing thermal oxidation of the silicon semiconductor substrate in an oxidizing environment.

13. The method of claim 11, wherein the semiconductor silicon substrate is a single crystalline silicon wafer of (100) crystal orientation.

14. The method of claim 11, wherein the dry oxidizing environment comprises:

oxygen gas;

nitrogen gas; and average room temperature humidity.

15. A method for forming a silicon oxide dielectric field oxide (FOX) isolation layer comprising:

providing a silicon structure;

forming upon the silicon structure a pad oxide layer;

forming upon the pad oxide layer a patterned silicon nitride mask layer;

oxidizing the silicon structure locally in a dry environment at a first temperature of from about 1200 to 1300° C., through the patterned silicon nitride mask layer to form silicon oxide dielectric field oxide (FOX) isolation layers which prevent out-diffusion of nitrogen species from the silicon nitride mask layer; and then oxidizing the silicon structure in a dry environment further at a second temperature from about 950 to 1000° C. to form greater thickness of silicon oxide layers.

16. The method of claim 15, wherein the pad oxide layer is formed employing thermal oxidation of the silicon structure in an oxidizing environment.

17. The method of claim 15, wherein the silicon structure is a single crystalline silicon wafer of (100) crystal orientation.

18. The method of claim 15, wherein the dry oxidizing environment comprises:

oxygen gas;

nitrogen gas; and average room temperature humidity.

* * * * *